(12) United States Patent
Kondo et al.

(10) Patent No.: US 10,497,639 B2
(45) Date of Patent: Dec. 3, 2019

(54) CARBON NANOTUBE STRUCTURE, HEAT DISSIPATION SHEET, AND METHOD OF MANUFACTURING CARBON NANOTUBE STRUCTURE

(71) Applicant: FUJITSU LIMITED, Kawasaki-shi, Kanagawa (JP)

(72) Inventors: Daiyu Kondo, Atsugi (JP); Shinichi Hirose, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 187 days.

(21) Appl. No.: 15/722,498

(22) Filed: Oct. 2, 2017

(65) Prior Publication Data
US 2018/0108594 A1 Apr. 19, 2018

(30) Foreign Application Priority Data
Oct. 17, 2016 (JP) .................. 2016-203898

(51) Int. Cl.
*H01L 23/373* (2006.01)
*B32B 37/06* (2006.01)
*H01L 21/48* (2006.01)

(52) U.S. Cl.
CPC .......... *H01L 23/3733* (2013.01); *B32B 37/06* (2013.01); *H01L 21/4878* (2013.01)

(58) Field of Classification Search
CPC ............. H01L 23/3733; H01L 21/4878; H01L 21/4882; H01L 23/367; H01L 23/373; H01L 23/42; H01L 24/27; H01L 51/0045; H01L 51/0048; H01L 51/529; H01L 2924/1033; H01L 2924/13064; H01L 2924/814; B32B 37/06; F28F 21/02

USPC ......................................................... 165/172
See application file for complete search history.

(56) References Cited

U.S. PATENT DOCUMENTS

| | | | | |
|---|---|---|---|---|
| 2004/0007965 A1* | 1/2004 | Kijima | ................ | H01J 9/481 313/495 |
| 2004/0090171 A1* | 5/2004 | Nakamura | ............. | H01J 29/46 313/495 |
| 2004/0217382 A1* | 11/2004 | Konuma | ............. | B82Y 10/00 257/202 |
| 2005/0029924 A1* | 2/2005 | Okai | .................... | B82Y 10/00 313/495 |
| 2005/0244325 A1* | 11/2005 | Nam | .................... | B82Y 10/00 423/414 |
| 2006/0212974 A1* | 9/2006 | Kawabata | ............ | B82Y 30/00 423/447.3 |
| 2008/0131352 A1* | 6/2008 | Kondo | ................. | B82Y 30/00 423/447.3 |

(Continued)

FOREIGN PATENT DOCUMENTS

| | | |
|---|---|---|
| JP | 2005-150362 | 6/2005 |
| JP | 2006-147801 | 6/2006 |

(Continued)

*Primary Examiner* — Justin M Jonaitis
(74) *Attorney, Agent, or Firm* — Fujitsu Patent Center

(57) ABSTRACT

A carbon nanotube structure includes a plurality of carbon nanotubes, and a graphite film that binds one ends of the plurality of carbon nanotubes. And a heat dissipation sheet includes a plurality of carbon nanotube structures arranged in a sheet form, wherein each of the carbon nanotube structures includes a plurality of carbon nanotubes, and a graphite film that binds one ends of the plurality of carbon nanotubes.

10 Claims, 22 Drawing Sheets

(56) References Cited

U.S. PATENT DOCUMENTS

| | | | |
|---|---|---|---|
| 2009/0035209 A1* | 2/2009 | Kondo | B82Y 30/00 423/447.1 |
| 2009/0237886 A1* | 9/2009 | Iwai | H01L 23/373 361/708 |
| 2010/0122798 A1 | 5/2010 | Hashimoto et al. | |
| 2011/0003174 A1* | 1/2011 | Hikata | B82Y 10/00 428/688 |

FOREIGN PATENT DOCUMENTS

| | | |
|---|---|---|
| JP | 2010-121867 | 6/2010 |
| JP | 2014-003144 | 1/2014 |

* cited by examiner

FIG. 3D
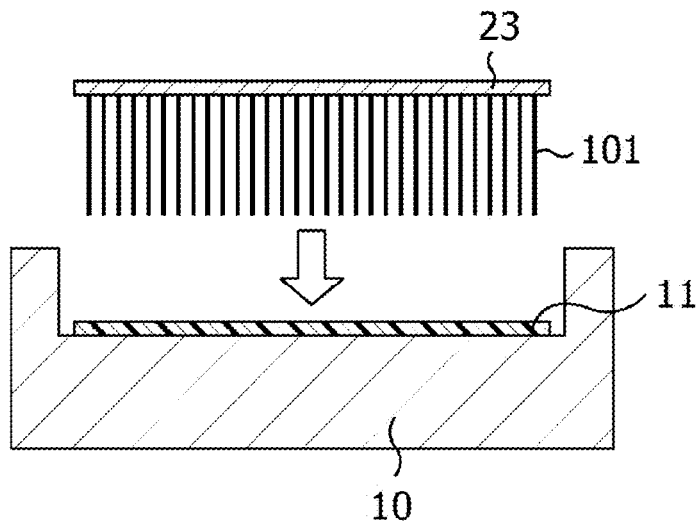
FIG. 3E
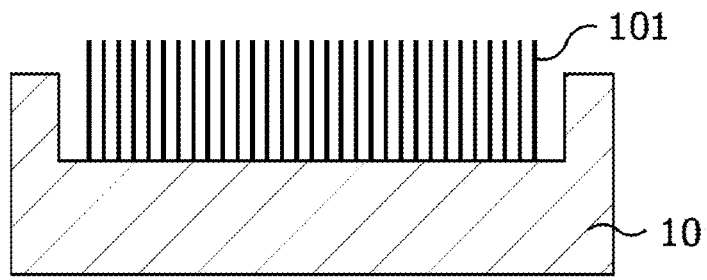
FIG. 3F
ELECTRON BEAM IRRADIATION
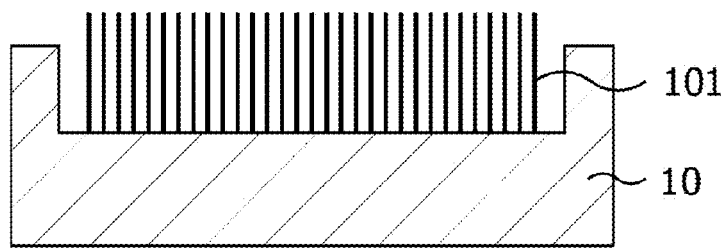

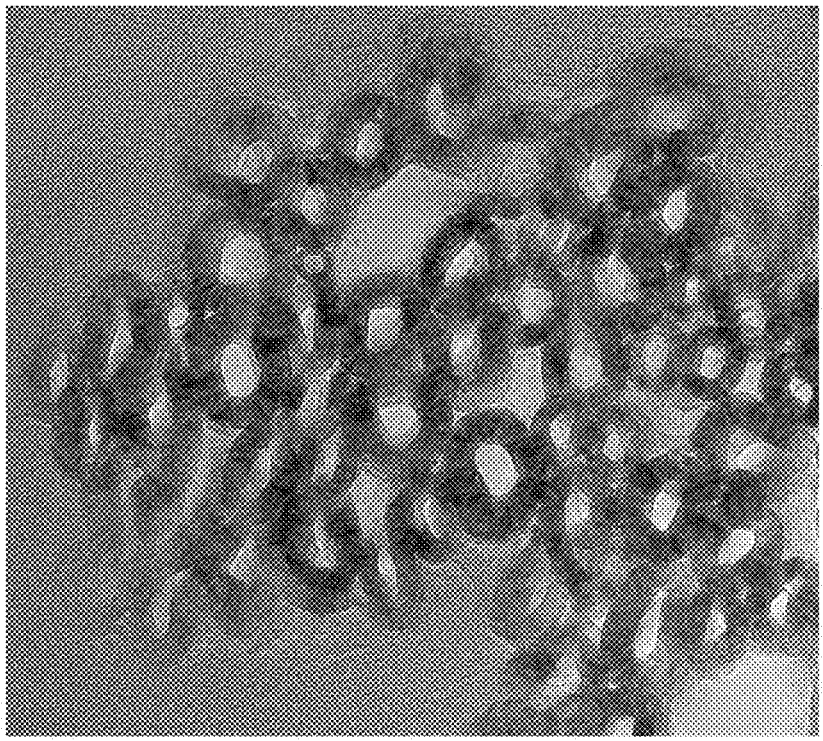
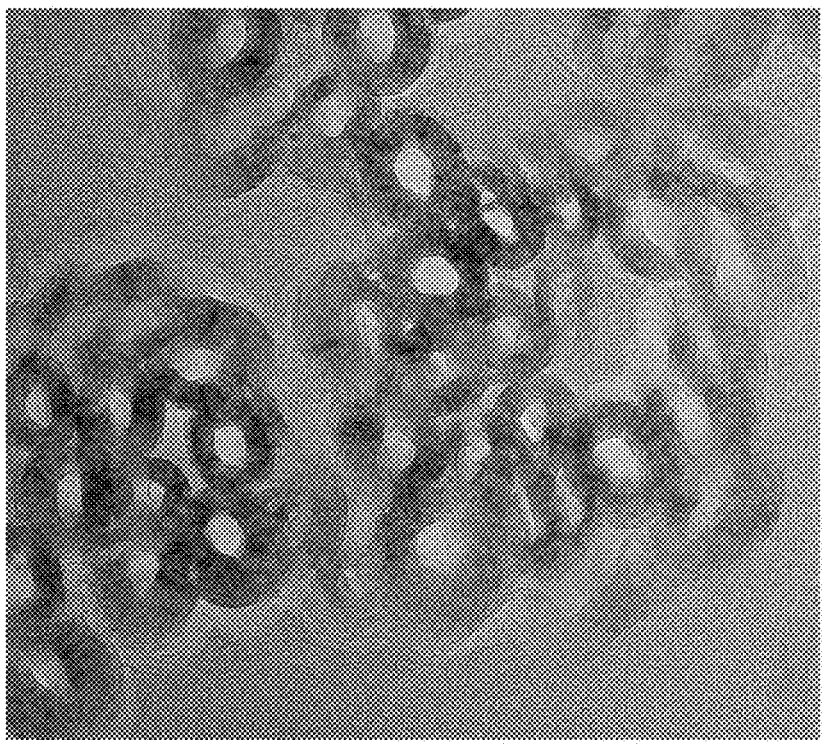

FIG. 9A
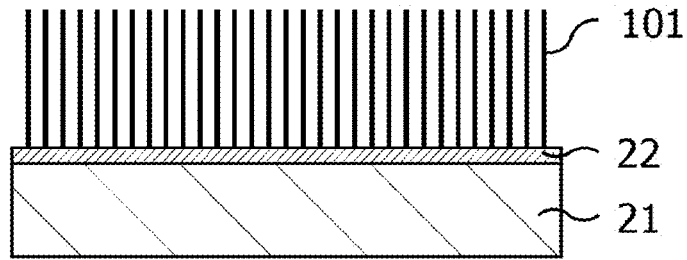
FIG. 9B
ELECTRON BEAM IRRADIATION
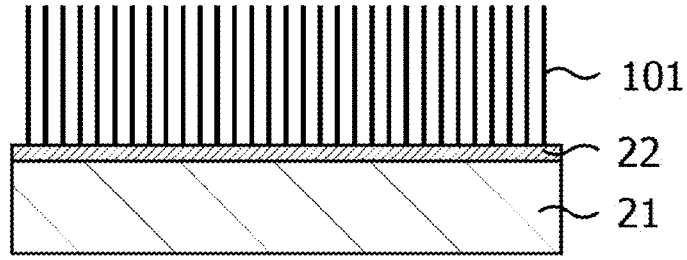
FIG. 9C
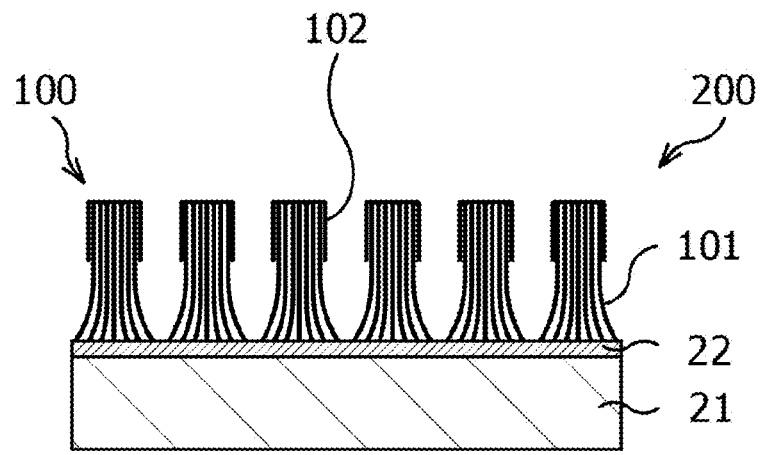

FIG. 11A
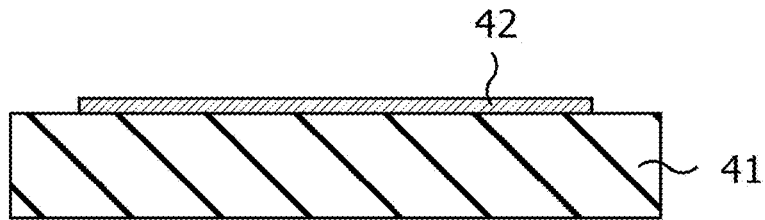
FIG. 11B
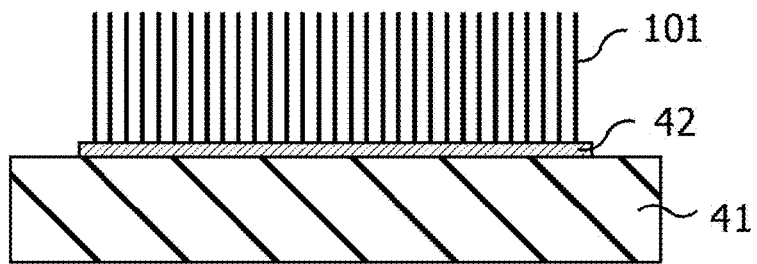
FIG. 11C
ELECTRON BEAM IRRADIATION
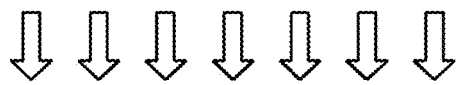
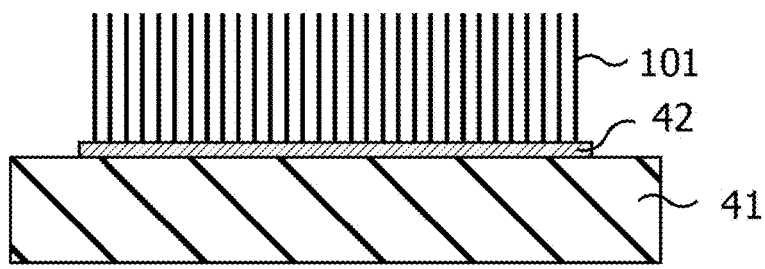

FIG. 14A
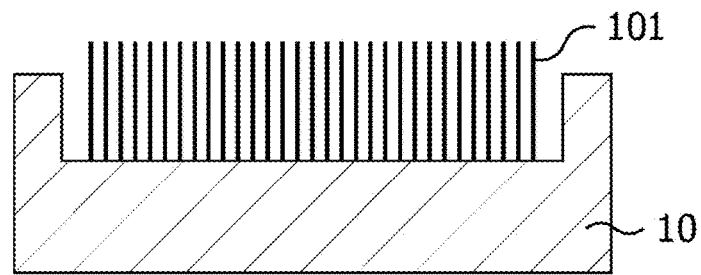
FIG. 14B
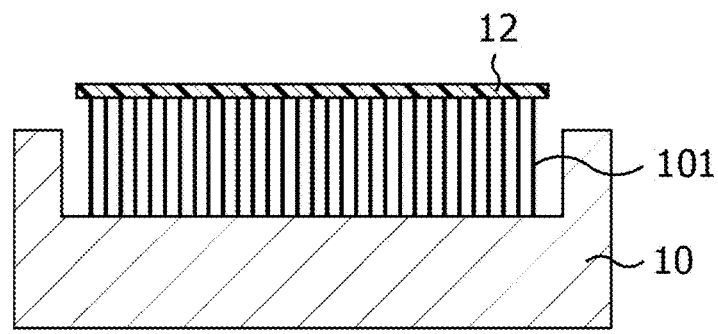
FIG. 14C
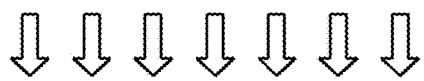
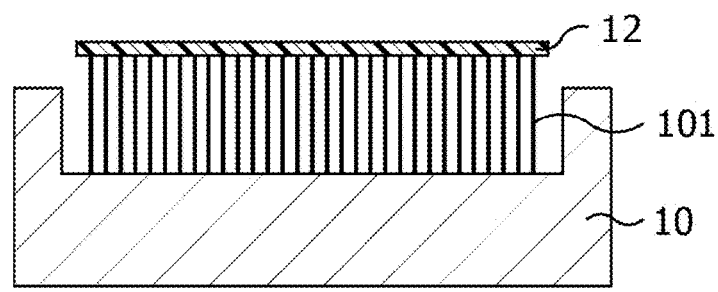

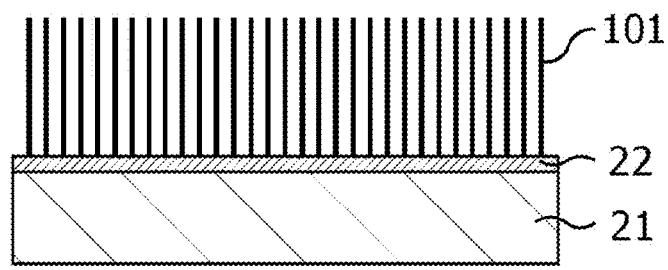
FIG. 15A
ELECTRON BEAM IRRADIATION
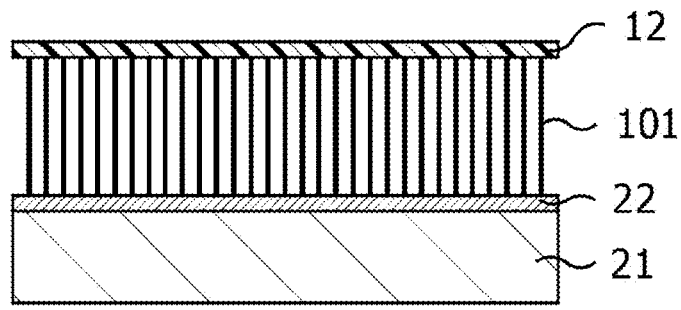
FIG. 15B
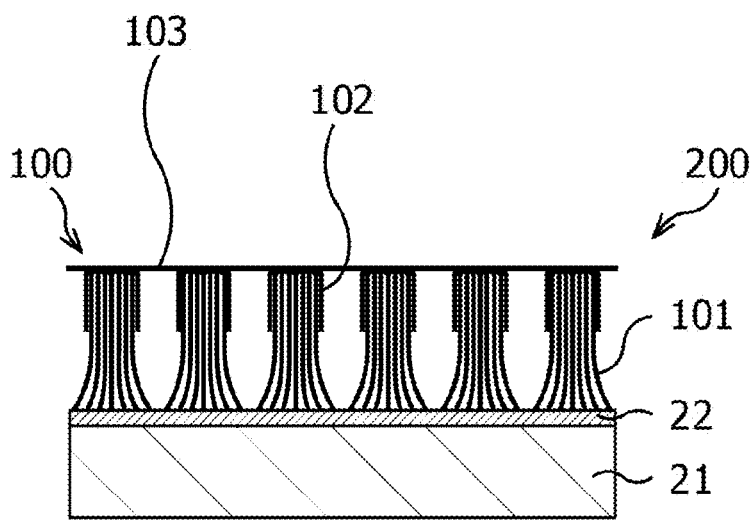
FIG. 15C FIG. 16A
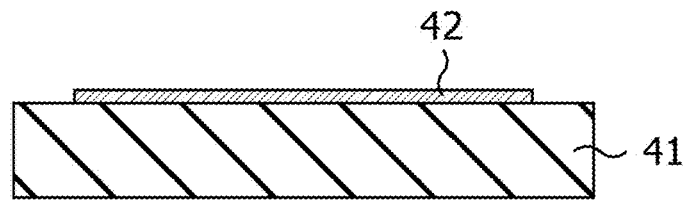
FIG. 16B
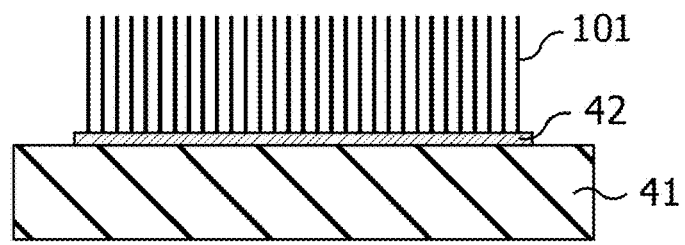
FIG. 16C
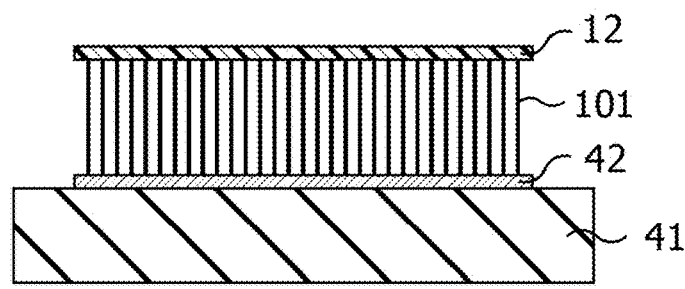
FIG. 16D
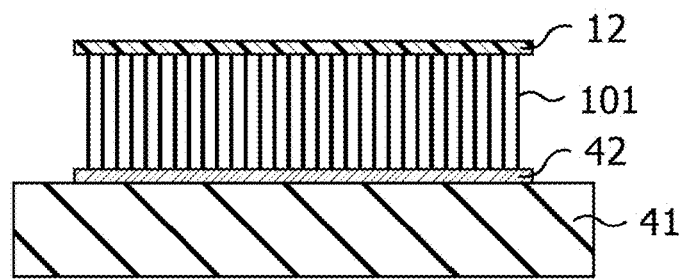

CARBON NANOTUBE STRUCTURE, HEAT DISSIPATION SHEET, AND METHOD OF MANUFACTURING CARBON NANOTUBE STRUCTURE

CROSS-REFERENCE TO RELATED APPLICATION

This application is based upon and claims the benefit of priority of the prior Japanese Patent Application No. 2016-203898, filed on Oct. 17, 2016, the entire contents of which are incorporated herein by reference.

FIELD

The embodiments discussed herein are related to a carbon nanotube structure, a heat dissipation sheet, and a method of manufacturing the carbon nanotube structure.

BACKGROUND

A heat spreader is attached to a semiconductor element via a heat dissipation material (a thermal interface material: TIM). As the heat dissipation material, indium may be exemplified. However, since the heat generated by a semiconductor element used for high performance computing (HPC) is very high, a material having a higher heat resistance and a higher thermal conductivity is required. As such a material, a carbon nanotube sheet may be exemplified. A carbon nanotube sheet is composed of a bundle of numerous carbon nanotubes bonded to each other by a van der Waals force.

However, the van der Waals force is significantly weaker than a metallic bonding force. Thus, at the time of handling, the bundle of carbon nanotubes may be easily unraveled, and the sheet shape thereof is difficult to maintain. Although there has been proposed a carbon nanotube sheet in which the bonding of carbon nanotubes is reinforced by a resin, the thermal conductivity is reduced. The thermal conductivity of the resin ranges from about 1 W/m·K to about 10 W/m·K, which is equal to or less than about $1/100$ of the thermal conductivity of carbon nanotubes.

Although there has also been proposed a carbon nanotube sheet in which tip ends of carbon nanotubes are bound with a polymer film, a sufficient thermal conductivity is not obtained even with this carbon nanotube sheet. When carbon nanotubes are sandwiched between a heat spreader and a semiconductor element, a large stress may act on the carbon nanotubes so that the carbon nanotubes may buckle.

The followings are reference documents.
[Document 1] Japanese Laid-Open Patent Publication No. 2005-150362,
[Document 2] Japanese Laid-Open Patent Publication No. 2006-147801,
[Document 3] Japanese Laid-Open Patent Publication No. 2014-003144 and
[Document 4] Japanese Laid-Open Patent Publication No. 2010-121867.

SUMMARY

According to an aspect of the embodiments, a carbon nanotube structure includes a plurality of carbon nanotubes, and a graphite film that binds one ends of the plurality of carbon nanotubes.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 3A to 3I are views illustrating a method of manufacturing the heat dissipation sheet according to the second embodiment in the order of processes;

FIGS. 5A and 5B are views illustrating transmission electron microscope photographs;

FIGS. 9A to 9E are views illustrating a method of manufacturing a heat dissipation sheet according to a fourth embodiment in the order of processes;

FIGS. 11A to 11F are views illustrating a method of manufacturing a bump according to a sixth embodiment in the order of processes;

FIGS. 14A to 14F are views illustrating a method of manufacturing a heat dissipation sheet according to an eighth embodiment in the order of processes;

FIGS. 15A to 15C are views illustrating a method of manufacturing a heat dissipation sheet according to a ninth embodiment in the order of processes;

FIGS. 16A to 16D are views illustrating a method of manufacturing a bump according to a tenth embodiment in the order of processes.

DESCRIPTION OF EMBODIMENTS

Hereinafter, embodiments will be described in detail with reference to accompanying drawings.

First Embodiment

Figure 1A:
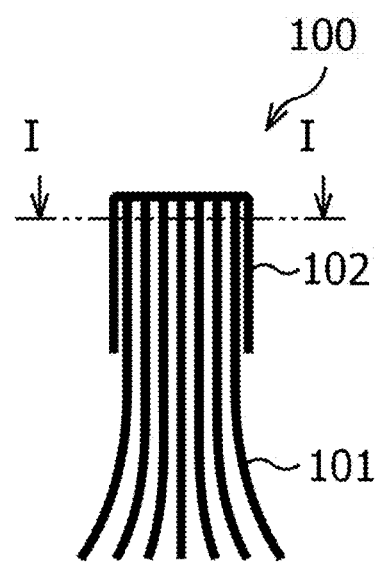
FIGS. 1A and 1B are views illustrating a carbon nanotube structure according to a first embodiment.
Figure 1B:
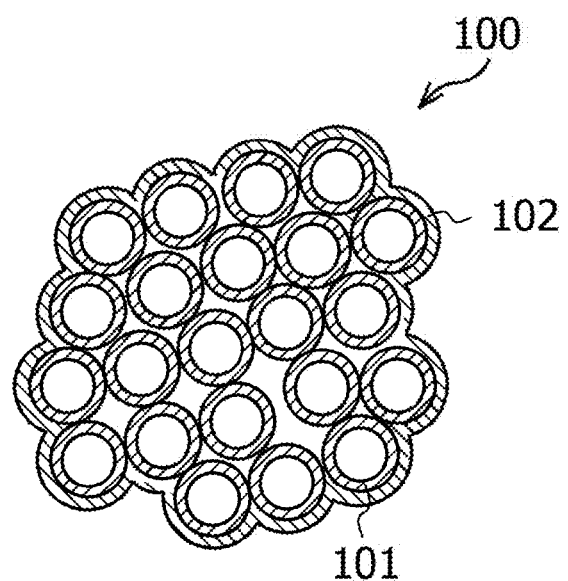

First, a first embodiment will be described. FIGS. 1A and 1B are views illustrating a carbon nanotube structure according to the first embodiment.

As illustrated in FIGS. 1A and 1B, a carbon nanotube structure 100 according to the first embodiment includes a plurality of carbon nanotubes 101, and a graphite film 102 binding one ends of the plurality of carbon nanotubes 101. FIG. 1A is a view illustrating the carbon nanotube structure 100 when viewed in a direction perpendicular to a direction in which the carbon nanotubes 101 extend. FIG. 1B is a view illustrating a cross section perpendicular to a direction in which the carbon nanotubes 101 extend, and corresponds to a cross-sectional view along the line I-I in FIG. 1A.

According to the carbon nanotube structure 100, since the bundle of the carbon nanotubes 101 is reinforced by the graphite film 102, a high strength may be obtained. The graphite film 102 also has high heat conductivity and a high conductivity like the carbon nanotubes 101. Thus, as described below, the graphite film 102 may be used as a part of, for example, a heat dissipation (thermal interface material: TIM) sheet or a bump.

Second Embodiment

Figure 2A:
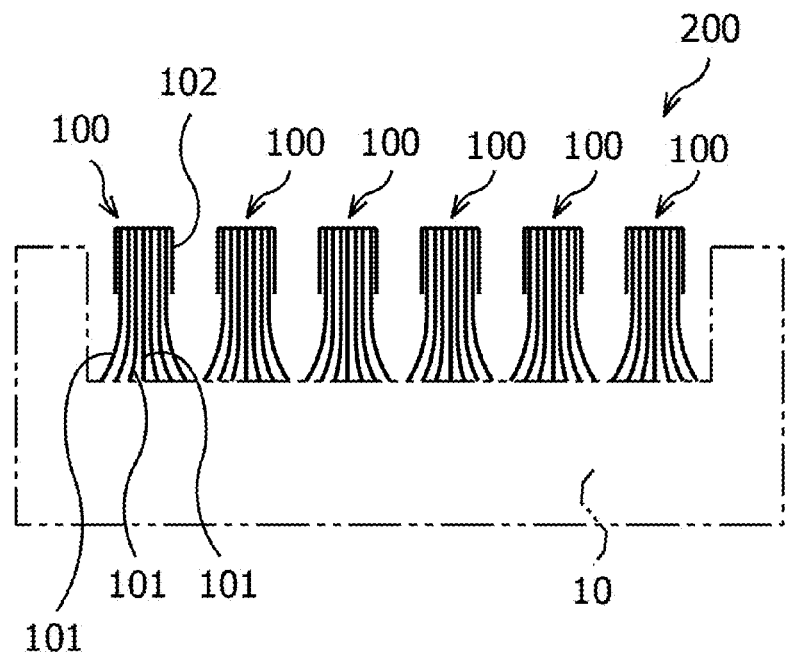
FIGS. 2A and 2B are views illustrating a heat dissipation sheet according to a second embodiment.
Figure 2B:
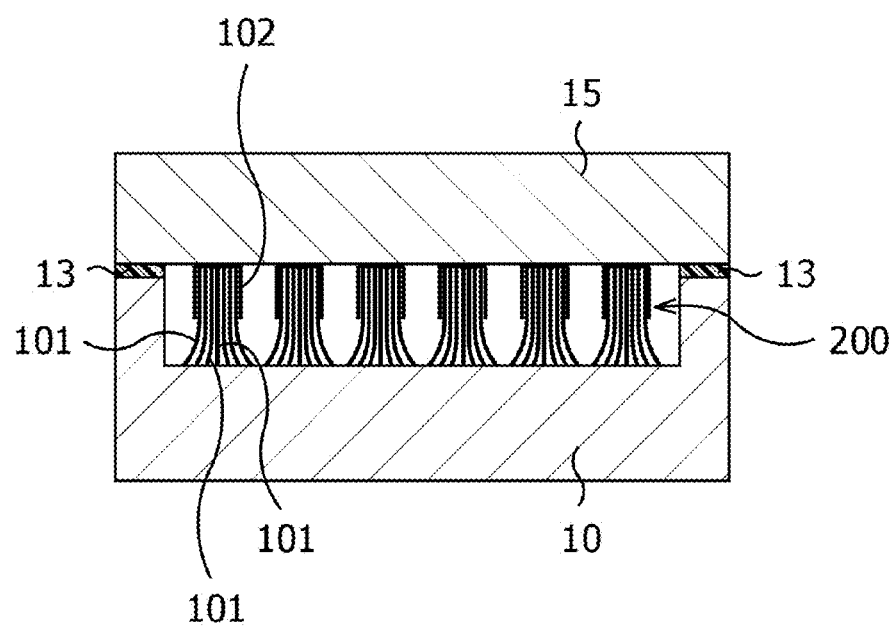

Hereinafter, the second embodiment will be described. The second embodiment relates to a heat dissipation sheet including a carbon nanotube structure. FIGS. 2A and 2B are views illustrating a heat dissipation sheet according to the second embodiment.

A heat dissipation sheet 200 according to the second embodiment includes a plurality of carbon nanotube structures 100, as illustrated in FIG. 2A. The plurality of carbon nanotube structures 100 are arranged in a sheet shape. The heat dissipation sheet 200 is provided on, for example, a heat spreader 10 when used. As a material for the heat spreader 10, a metal such as copper, alumina, or aluminum nitride may be exemplified. The heat spreader 10 is an example of a heat dissipation member.

As illustrated in FIG. 2B, the heat spreader 10 on which the heat dissipation sheet 200 is provided is attached to a semiconductor element 15. Here, the heat dissipation sheet 200 is in contact with both the semiconductor element 15 and the heat spreader 10, and transfers heat generated in the semiconductor element 15 to the heat spreader 10. A sealant 13 is provided at the tip end of the container-shaped heat spreader 10, and the heat spreader 10 is fixed to the semiconductor element 15 through the sealant 13. The semiconductor element 15 is, for example, a central processing unit (CPU) used for a server or a personal computer, and a CPU suitable for HPC may be used.

The heat dissipation sheet 200 includes the high-strength carbon nanotube structures 100, and thus hardly buckles even when a stress is applied to the heat dissipation sheet 200 between the heat spreader 10 and the semiconductor element 15. The carbon nanotube structures 100 may be directly in contact with the semiconductor element 15 as a heating element, and is in contact with the semiconductor element 15 with a larger area than each carbon nanotube 101. Thus, stable heat conduction may be achieved with a high efficiency.

Hereinafter, a method of manufacturing the heat dissipation sheet according to the second embodiment will be described. FIGS. 3A to 3I are views illustrating a method of manufacturing the heat dissipation sheet according to the second embodiment in the order of processes.

Figure 3A:
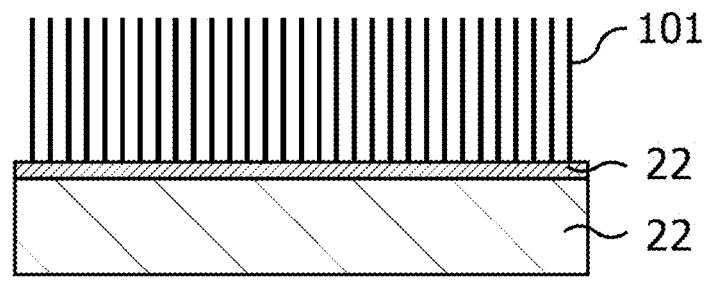

First, as illustrated in FIG. 3A, a catalyst film 22 is formed on a substrate 21, and the plurality of carbon nanotubes 101 are formed on the catalyst film 22. As the catalyst film 22, for example, an iron film having a thickness ranging from about 0.5 nm to 5 nm is formed. The catalyst film 22 may be formed using, for example, a sputtering method, an electron beam (EB) deposition method or a molecular beam epitaxy (MBE) method. The carbon nanotubes 101 may be grown by, for example, a hot filament chemical vapor deposition (CVD) method. For example, as a raw material gas, a mixed gas of acetylene and argon is used, the substrate temperature is set to range from about 550° C. to about 700° C., and the pressure is set to range from about 0.1 kPa to about 10 kPa. The carbon nanotubes 101 may also be grown by a remote plasma CVD method, a plasma CVD method, or a thermal CVD method. The carbon nanotubes 101 extend in a direction substantially perpendicular to the surface of the substrate 21. When an iron film having a thickness of 2.5 nm is used as the catalyst film 22, the substrate temperature is set to about 620° C., and the pressure is set to about 1 kPa, the carbon nanotubes 101 having a length of about 150 μm is obtained for about 60 min. When the thickness of the Fe film is about 1 nm, and other conditions are the same, the carbon nanotubes 101 with a length of about 250 μm is obtained for about 60 min. As a raw material for the carbon nanotubes 101, hydrocarbons such as methane and ethylene, or alcohols such as ethanol and methanol may be used. As the catalyst, cobalt, nickel, iron, gold, silver or platinum or an alloy of any combination thereof may be used. When iron, cobalt or nickel is used as the catalyst, the carbon nanotubes 101 may be grown at a temperature ranging from about 300° C. to about 1100° C., and the growth temperature may be set to range from about 500° C. to about 800° C. As a base film under the catalyst film 22, a film containing molybdenum, titanium, hafnium, zirconium, niobium, vanadium, tantalum nitride, titanium silicide, aluminum, aluminum oxide, titanium oxide, tantalum, tungsten, copper, gold or platinum or a combination thereof may be formed. The metal may be used alone, used as a metal nitride or a metal oxide, or used as an alloy.

Figure 3B:
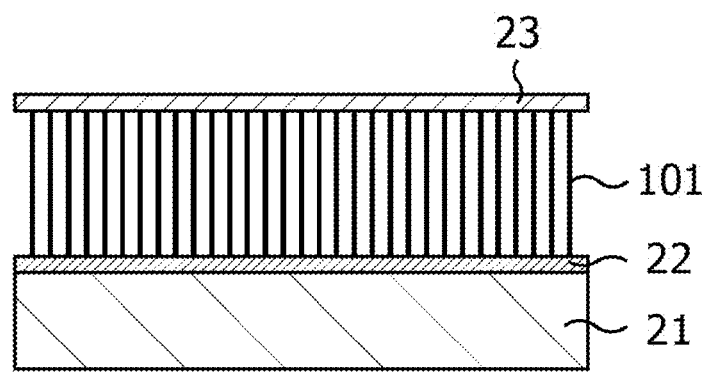

Subsequently, as illustrated in FIG. 3B, a transfer substrate 23 is attached to the tip end of the bundle of the carbon nanotubes 101. As the transfer substrate 23, for example, a metal film such as a gold film is used.

Figure 3C:
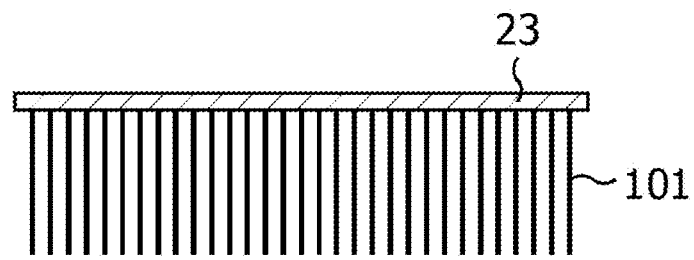

Thereafter, as illustrated in FIG. 3C, the catalyst film 22 and the substrate 21 are removed from the bundle of the carbon nanotubes 101.

Subsequently, as illustrated in FIG. 3D, the bundle of the carbon nanotubes 101 is press-bonded to the heat spreader 10 using a resin sheet 11 made of a thermoplastic resin. During the press-bonding, for example, the temperature is set to range from about 150° C. to about 200° C., the pressure force is set to range from about 150 N (Newton) to about 200 N, and the time is set to range from about 5 min to about 60 min. Under such conditions, when the bundle of the carbon nanotubes 101 is press-bonded, the bundle of the carbon nanotubes 101 may be brought into direct contact with the heat spreader 10 while being impregnated with the thermoplastic resin. As the material for the resin sheet 11, for example, thermoplastic resins such as a polyamide-based thermoplastic resin, a polyurethane-based thermoplastic resin, and a polyolefin-based thermoplastic resin, thermosetting resins such as a polyimide-based thermosetting resin and an epoxy-based thermosetting resin, acrylic resins, silicone resins, polyvinyl resins and waxes may be exemplified. These resins may be easily penetrated into the bundle of the carbon nanotubes 101.

Subsequently, as illustrated in FIG. 3E, the transfer substrate 23 is removed from the bundle of the carbon nanotubes 101.

Subsequently, as illustrated in FIG. 3F, the bundle of the carbon nanotubes 101 is irradiated with an electron beam. The irradiation with the electron beam may be performed in a vacuum. This is because when the oxygen concentration in the atmosphere is high, the carbon nanotubes 101 may burn due to heat generation according to the irradiation with the electron beam. For the evacuation, a pump with an exhaust force equal to or higher than that of a rotary pump may be used. The current density of the electron beam is set to range from, for example, about 200 µA to about 500 µA per 50 µm square.

Figure 3G:
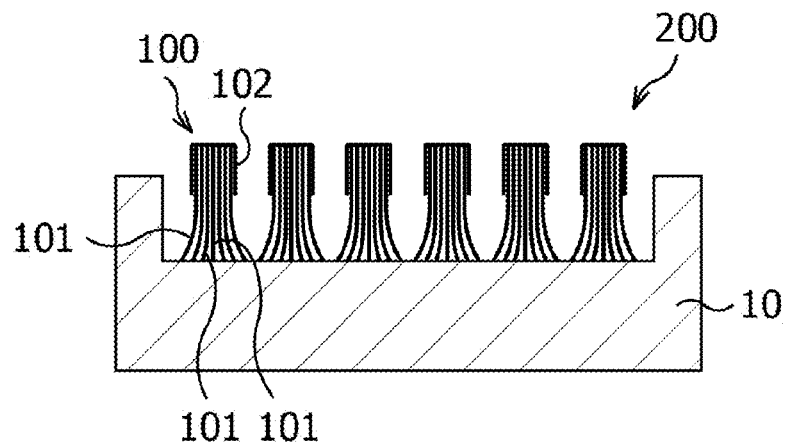

As a result of the electron beam irradiation, as illustrated in FIG. 3G, a part of one side of the carbon nanotubes 101 irradiated with the electron beam melts or evaporates, and almost at the same time, the graphite film 102 which binds one ends of the carbon nanotubes 101 is formed using molten or evaporated carbon as a raw material. Amorphous carbon adhering to the side walls, etc. of the carbon nanotubes 101 at the time of synthesizing the carbon nanotubes 101 may also be used as a raw material of the graphite film 102. In this manner, the carbon nanotube structure 100 including the plurality of carbon nanotubes 101 and the graphite film 102 is formed, and the heat dissipation sheet 200 including a plurality of carbon nanotube structures 100 is obtained.

Figure 3H:
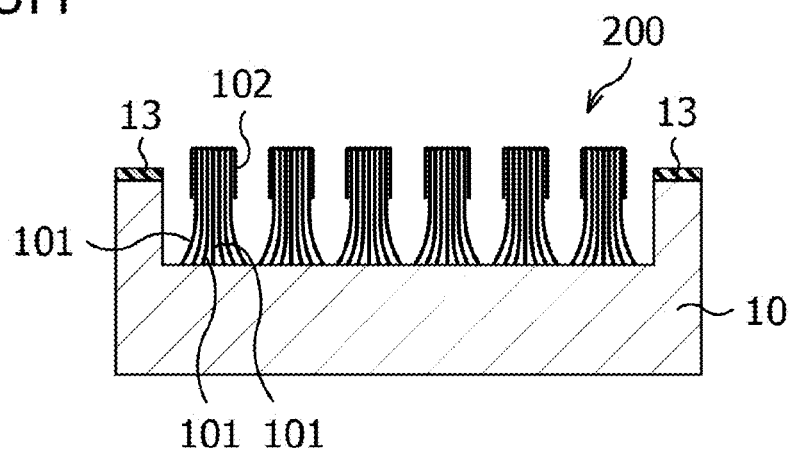
Figure 3I:
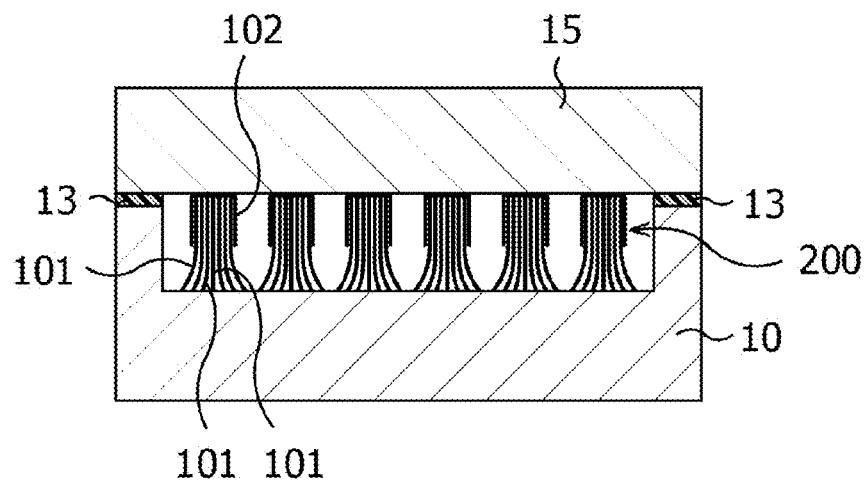

Then, when the heat spreader 10 is attached to the semiconductor element, as illustrated in FIG. 3H, the sealant 13 is applied to the tip end of the container-shaped heat spreader 10, and as illustrated in FIG. 3I, the heat spreader 10 is fixed to the semiconductor element 15 such that the heat dissipation sheet 200 is interposed between the heat spreader 10 and the semiconductor element 15. Here, a stress acts on the heat dissipation sheet 200 substantially parallel to a direction in which the carbon nanotubes 101 extend. However, the carbon nanotubes 101 are bound and reinforced by the graphite film 102, and thus hardly buckle.

Figure 4B:
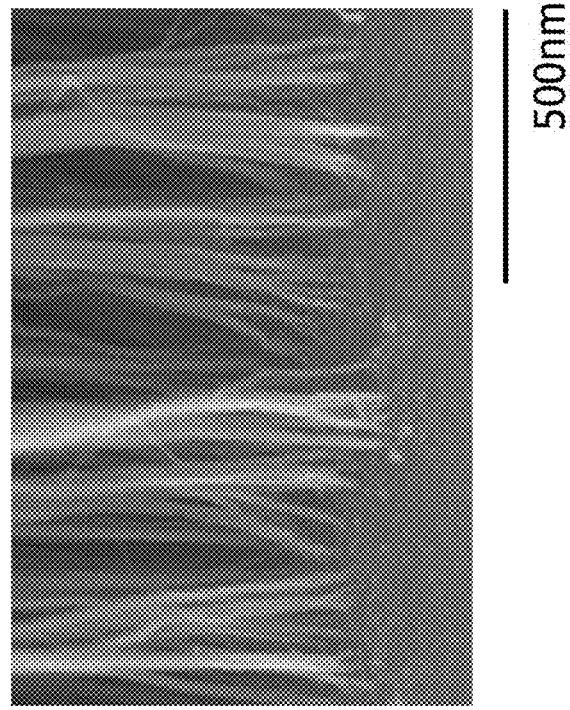
FIGS. 4A and 4B are views illustrating scanning electron microscope photographs.
Figure 4A:
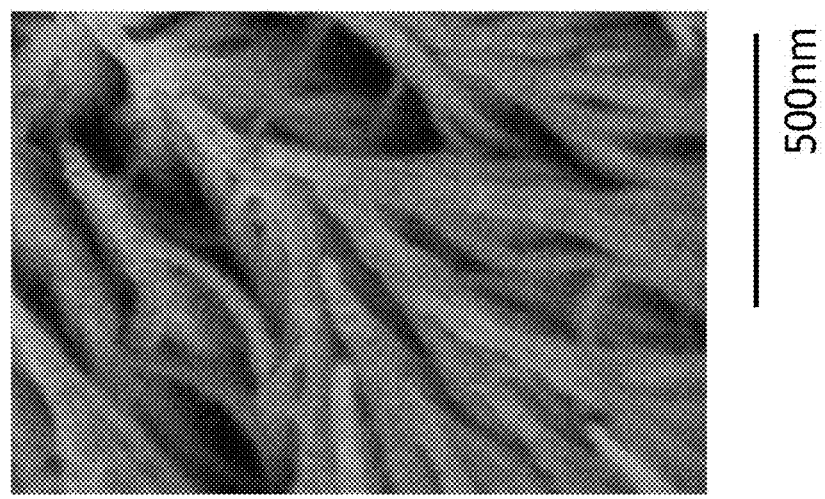
Figure 6:
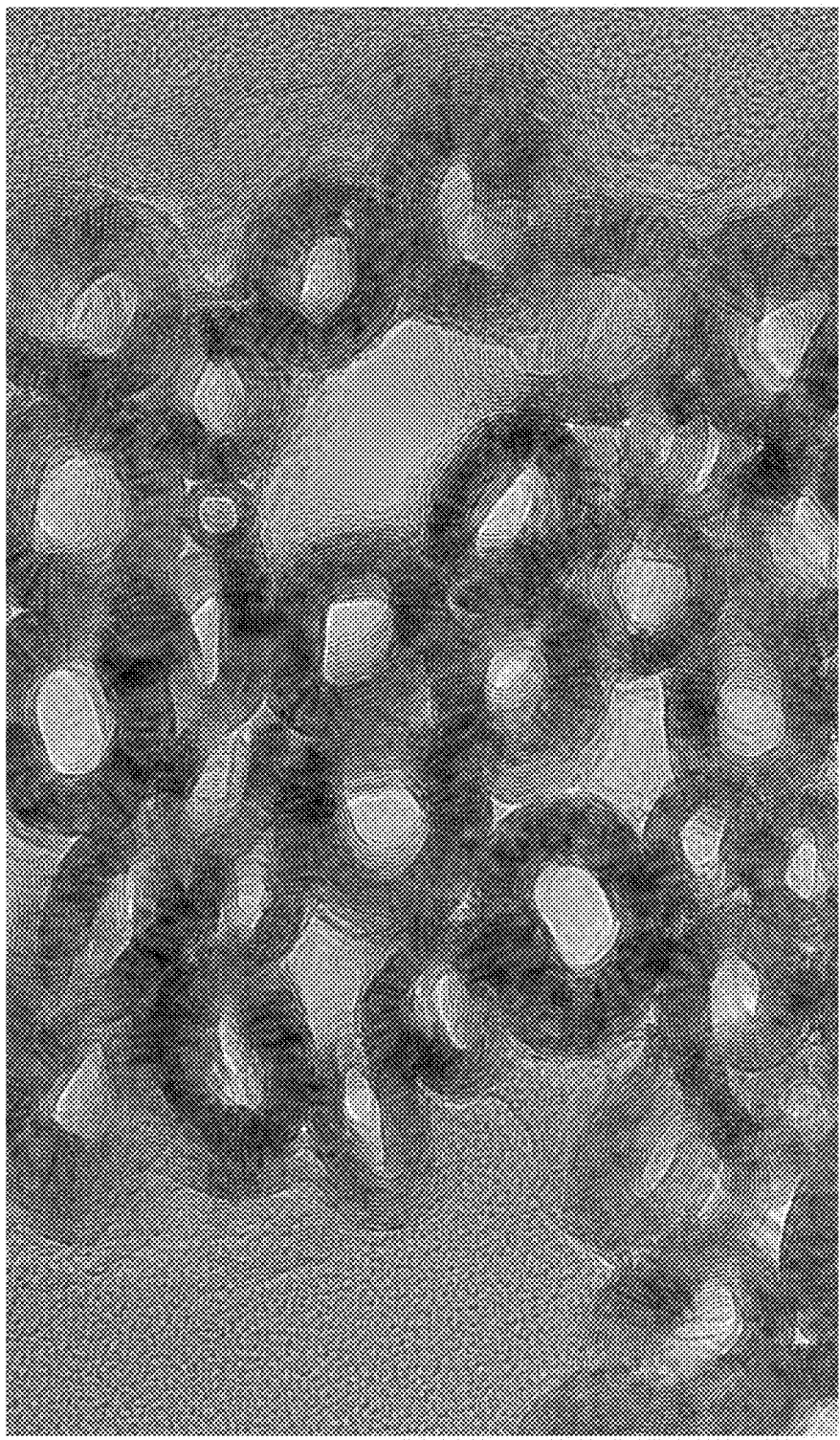
FIG. 6 is a view illustrating another transmission electron microscope photograph.

FIGS. 4A and 4B, 5A and 5B and 6 illustrate microscope photographs of a heat dissipation sheet manufactured by the above described method. FIGS. 4A and 4B illustrate scanning electron microscope (SEM) photographs at the same magnification at different fields of view. FIGS. 5A and 5B illustrate transmission electron microscope (TEM) photographs at the same magnification at different fields of view. FIG. 6 illustrates a TEM photograph at a higher magnification than FIGS. 5A and 5B. TEM photographs illustrated in FIGS. 5A and 5B or FIG. 6 are photographs of a section substantially perpendicular to the longitudinal direction of the carbon nanotubes (see FIG. 1B).

As illustrated in FIG. 4A, one ends (tip ends) of the plurality of carbon nanotubes are integrated over a length in the range of about 50 nm to about 500 nm, and as illustrated in FIG. 4B, the other ends (roots) of the carbon nanotubes are separate from each other. The diameter of the nanotubes is about 5 nm at the roots of the carbon nanotubes, whereas the diameter of a portion formed by the integrated tip ends of the carbon nanotubes is about 50 nm. Furthermore, it can be seen that even in the portion where the carbon nanotubes are not integrated with each other, the diameter of the nanotubes remains thick over a length in the range of several µm to about 50 µm from the top of the portion. In consideration of the entire length (about 150 µm), it can be seen that the diameter of the carbon nanotubes generally remains thick in the region of about half of the entire length.

As illustrated in FIGS. 5A and 5B and FIG. 6, a bundle of a plurality of carbon nanotubes each having an annular cross section is bound with a graphite film to constitute the carbon nanotube structure. The thickness of the graphite film ranges from about 1 nm to about 20 nm. The thickness of the graphite film may range from about 1 nm to about 100 nm. The carbon nanotubes illustrated in FIGS. 5A and 5B or FIG. 6 also include carbon nanotubes having a diameter ranging from about 10 nm to about 20 nm. The carbon nanotubes having a large diameter indicate that tip ends of two or more carbon nanotubes are fused with each other by the irradiation of the electron beam. Further, the carbon nanotubes at the root remain thin, which indicates that the lower portions are not fused.

Figure 7A:
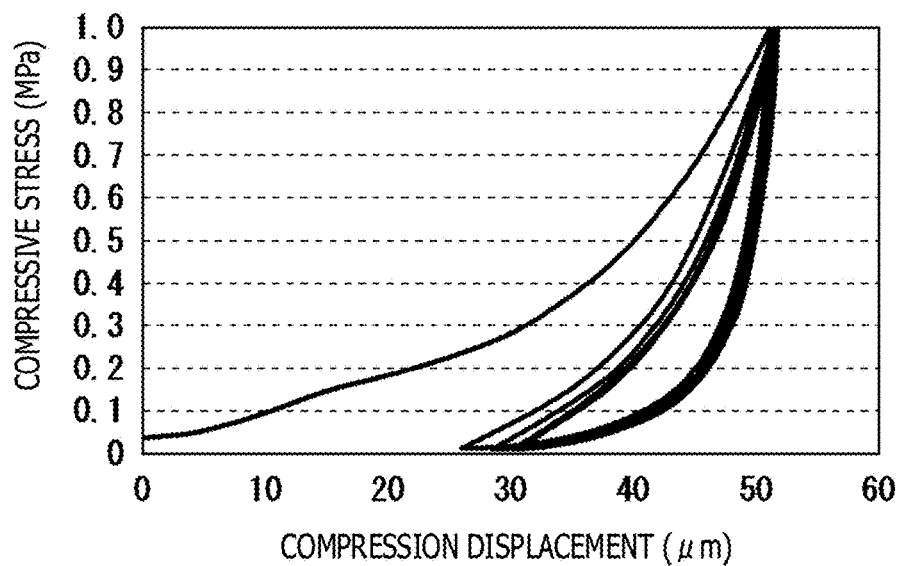
FIGS. 7A and 7B are views illustrating mechanical properties of the heat dissipation sheet.
Figure 7B:
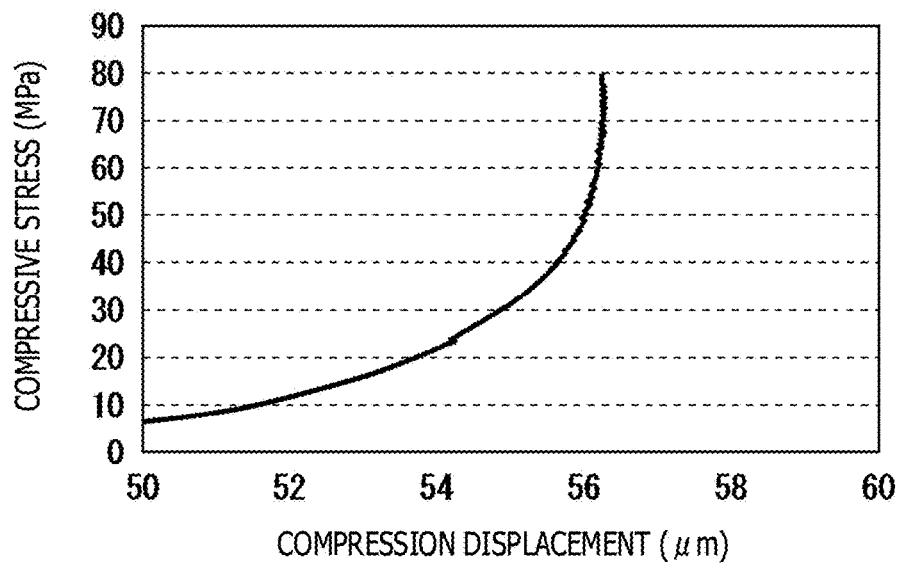

FIGS. 7A and 7B illustrate mechanical properties of the heat dissipation sheet manufactured by the above described method. FIG. 7A illustrates a change in a compression displacement when a compressive stress of about 1.0 MPa is repeatedly applied, and FIG. 7B illustrates a change in a compression displacement when a higher compressive stress is applied.

As illustrated in FIG. 7A, even when a compressive stress is repeatedly applied, the compression displacement is returned to about 30 µm by releasing the compression pressure. The thickness of the heat dissipation sheet is about 150 µm. Even when compressed to a thickness of about 100 µm, the heat dissipation sheet is restored to a thickness of about 120 µm. This suggests that the heat dissipation sheet exhibits an excellent elasticity. When compressed to about 100 µm, general carbon nanotubes having a length of about 150 µm buckle. As illustrated in FIG. 7B, even when a compressive stress of about 80 MPa is applied, the compression displacement is not significantly changed. This suggests that a specific strength is about 900 kNm/kg or more, and plastic deformation is not substantially caused at about 80 MPa. The specific strength of a stainless still wire is about 698 kNm/kg, and the specific strength of a titanium alloy is about 288 kNm/kg. This result clearly indicates excellent mechanical properties of the entire heat dissipation sheet manufactured by the above described method, and indicates that not only the integral structure covered with the graphite film but also carbon nanotubes at the roots have a high quality.

Furthermore, it has become clear that the quality of carbon nanotubes is improved by the irradiation with an electron beam. That is, when the irradiation amount of the electron beam is about 200 µA or more, it has become clear that the D-band peak located near 1300 $cm^{-1}$ at Raman spectroscopy, which is caused by a defect of carbon nanotubes, is largely reduced after irradiation of the electron beam. When the irradiation amount of the electron beam is about 200 µA or more, a ratio of G/D (a ratio of a G band around 1600 $cm^{-1}$ to a D band), that is, an index indicating the quality of carbon nanotubes, ranges from about 10 to about 20. Thus, it has become clear that the carbon nanotubes have a high quality. When the irradiation with the electron beam is not performed, the G/D ratio ranges from about 1 to about 2. Thus, it can be said that the defect is repaired and the quality of carbon nanotubes is significantly improved due to the irradiation with the electron beam. Then, in consideration of such a high G/D ratio, it is expected that the heat dissipation sheet is superior to indium in terms of a thermal resistance.

Third Embodiment

Figure 8A:
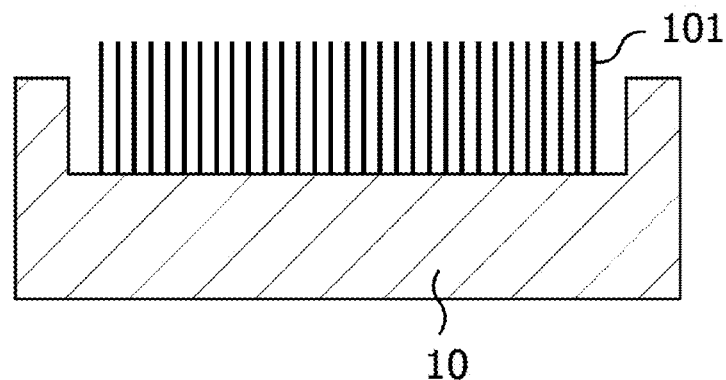
FIGS. 8A to 8C are views illustrating a method of manufacturing a heat dissipation sheet according to a third embodiment in the order of processes.
Figure 8B:
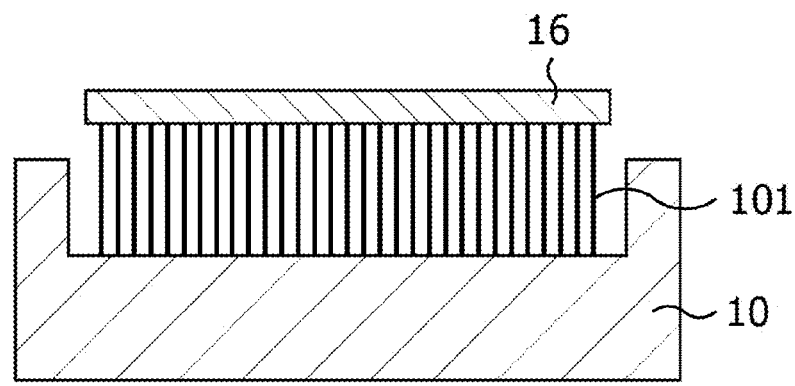
Figure 8C:
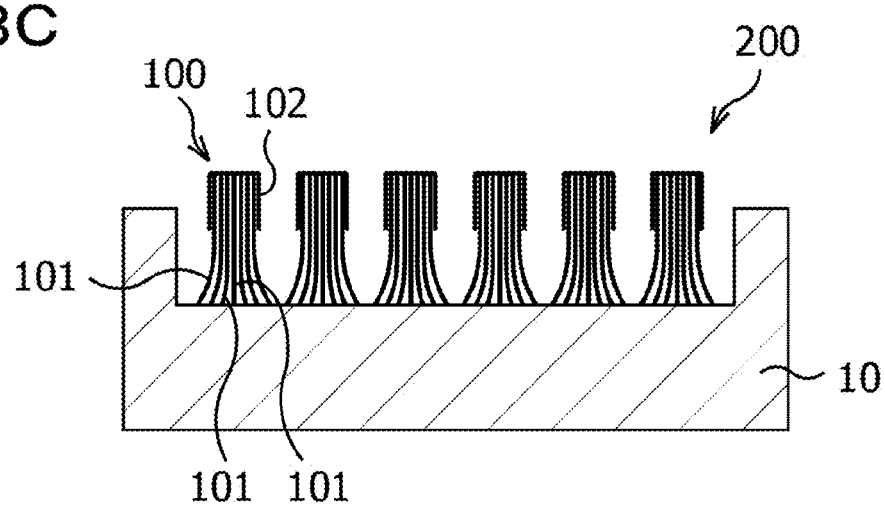

Hereinafter, a third embodiment will be described. The third embodiment relates to another example of a method of manufacturing the heat dissipation sheet according to the second embodiment. FIGS. 8A to 8C are views illustrating a method of manufacturing the heat dissipation sheet according to the third embodiment in the order of processes.

As illustrated in FIG. 8A, in the third embodiment, first, processes up to the removal of the transfer substrate 23 from the bundle of the carbon nanotubes 101 are performed as in the above described example. Subsequently, as illustrated in FIG. 8B, a carbon film 16 is formed on the tip end of the bundle of the carbon nanotubes 101. The carbon film 16 may be formed by, for example, a sputtering method, or an electron beam deposition method. The thickness of the carbon film 16 only has to range from about 1 nm to about 500 nm, or may range from about 10 nm to about 50 nm. Then, the carbon film 16 and the carbon nanotubes 101 are heated at a high temperature ranging from about 2000° C. to about 3000° C.

As a result of the heating at the high temperature, as illustrated in FIG. 8C, graphite films 102 are formed which binds one ends of the carbon nanotubes 101. In this manner, carbon nanotube structures 100 each including a plurality of carbon nanotubes 101 and a graphite film 102 are obtained, and a heat dissipation sheet 200 including a plurality of carbon nanotube structures 100 is obtained.

Then, when the heat spreader 10 is attached to the semiconductor element, as in the second embodiment, the sealant 13 is applied to the tip end of the container-shaped heat spreader 10 (see FIG. 3H), and the heat spreader 10 is fixed to the semiconductor element such that the heat dissipation sheet 200 is interposed between the heat spreader 10 and the semiconductor element (see FIG. 3I). Here, a stress acts on the heat dissipation sheet 200 substantially parallel to a direction in which the carbon nanotubes 101 extend. However, the carbon nanotubes 101 are bound and reinforced by the graphite film 102, and thus hardly buckle.

In the third embodiment, as the material for the heat spreader 10, alumina or aluminum nitride that may withstand a high temperature ranging from about 2000° C. to about 3000° C. may be used.

Fourth Embodiment

Hereinafter, a fourth embodiment will be described. The fourth embodiment relates to another example of a method of manufacturing the heat dissipation sheet according to the second embodiment. FIGS. 9A to 9E are views illustrating a method of manufacturing the heat dissipation sheet according to the fourth embodiment in the order of processes.

As illustrated in FIG. 9A, in the fourth embodiment, first, the catalyst film 22 is formed on the substrate 21, and a plurality of carbon nanotubes 101 are formed on the catalyst film 22 as in the second embodiment. Subsequently, as illustrated in FIG. 9B, the bundle of the carbon nanotubes 101 is irradiated with an electron beam.

As a result of the electron beam irradiation, as illustrated in FIG. 9C, the carbon nanotubes 101 are partially melt or evaporates at the side irradiated with the electron beam, and almost at the same time, the graphite films 102 which bind one ends of the carbon nanotubes 101 are formed using molten or evaporated carbon as a raw material. In this manner, carbon nanotube structures 100 each including a plurality of carbon nanotubes 101 and a graphite film 102 is formed, and the heat dissipation sheet 200 including a plurality of carbon nanotube structures 100 is obtained.

Figure 9D:
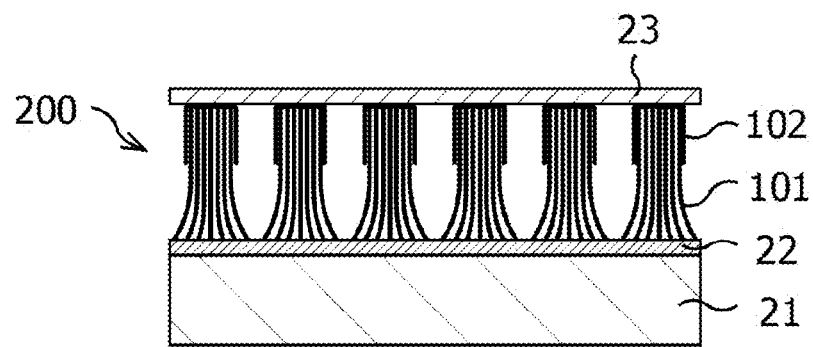
Figure 9E:
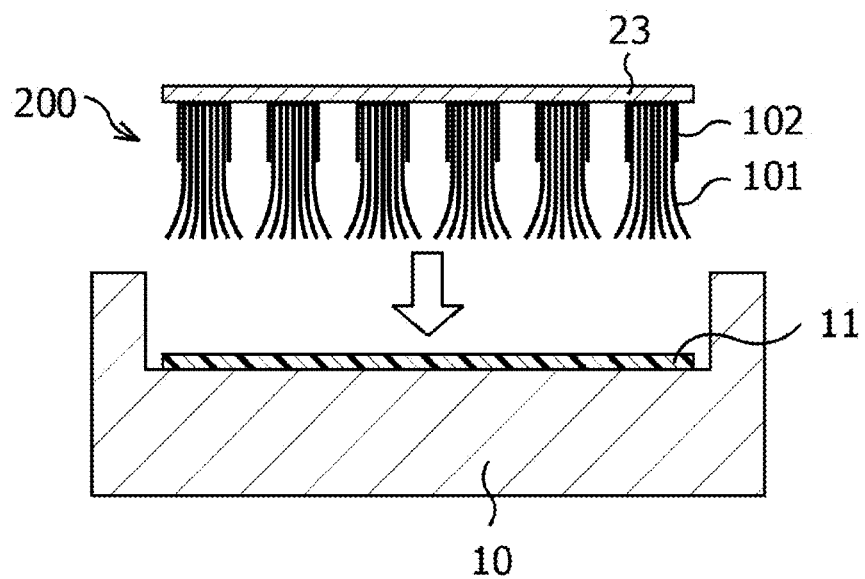

Subsequently, as illustrated in FIG. 9D, a transfer substrate 23 is attached to tip ends of the plurality of carbon nanotube structures 100. Then, as illustrated in FIG. 9E, the catalyst film 22 and the substrate 21 are removed from the heat dissipation sheet 200, and the heat dissipation sheet 200 is press-bonded onto the heat spreader 10 using the resin sheet 11 made of a thermoplastic resin. Subsequently, the transfer substrate 23 is removed from the bundle of the carbon nanotubes 101.

When the heat spreader 10 is attached to the semiconductor element, as in the second embodiment, the sealant 13 is applied to the tip end of the container-shaped heat spreader 10 (see FIG. 3H), and the heat spreader 10 is fixed to the semiconductor element such that the heat dissipation sheet 200 is interposed between the heat spreader 10 and the semiconductor element (see FIG. 3I). Here, a stress acts on the heat dissipation sheet 200 substantially parallel to a direction in which the carbon nanotubes 101 extend. However, the carbon nanotubes 101 are bound and reinforced by the graphite film 102, and thus hardly buckle.

As described above, the heat dissipation sheet 200 may be moved from one substrate where the carbon nanotubes are grown to another substrate provided for usage.

Fifth Embodiment

Figure 10A:
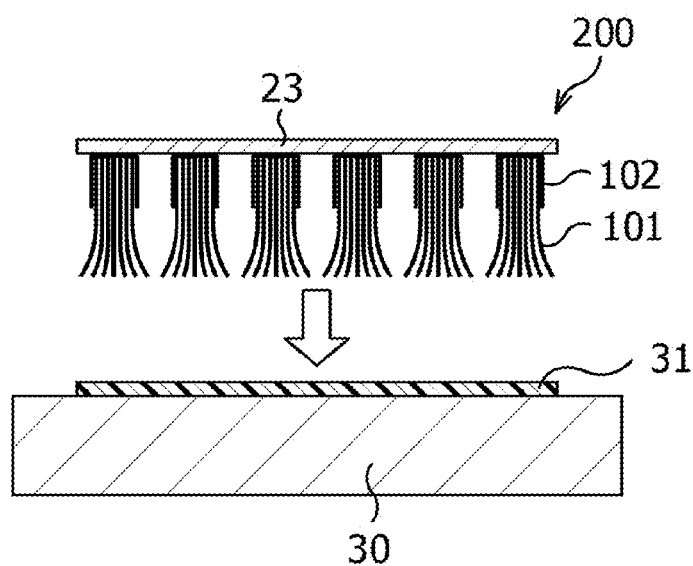
FIGS. 10A to 10C are views illustrating a method of manufacturing an in-vehicle semiconductor device according to a fifth embodiment in the order of processes.
Figure 10B:
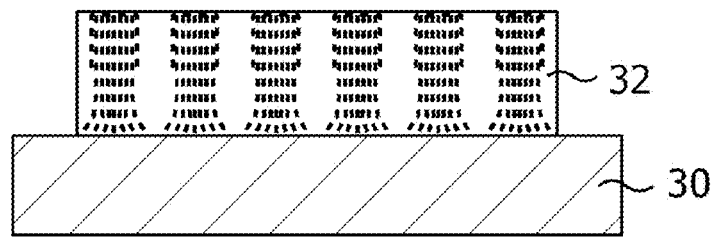
Figure 10C:
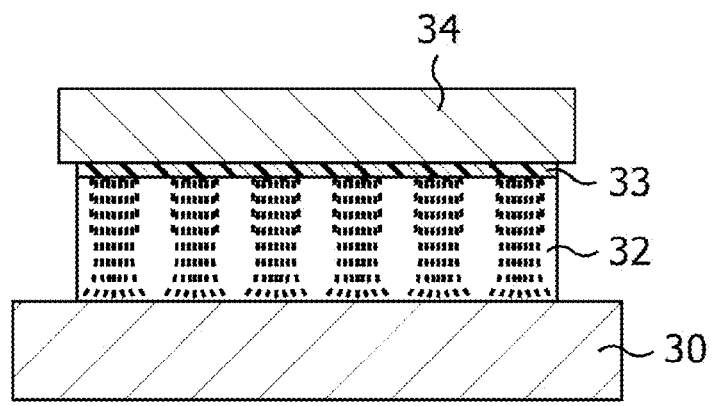

Hereinafter, a fifth embodiment will be described. The fifth embodiment relates to an in-vehicle semiconductor device including the heat dissipation sheet according to the second embodiment. FIGS. 10A to 10C are views illustrating a method of manufacturing the in-vehicle semiconductor device according to the fifth embodiment in the order of processes.

As in the fourth embodiment, in the fifth embodiment, first, processes up to the attachment of the transfer substrate 23 and the removal of the catalyst film 22 and the substrate 21 from the heat dissipation sheet 200 are performed (see FIG. 9E). Subsequently, as illustrated in FIG. 10A, the heat dissipation sheet 200 is press-bonded onto a cooling plate 30 using a resin sheet 31 made of a thermoplastic resin. As for a material for the cooling plate 30, copper is suitable. The cooling plate 30 is an example of the heat dissipation member.

Thereafter, as illustrated in FIG. 10B, the heat dissipation sheet 200 is embedded with an insulating film 32. As the insulating film 32, for example, an alumina film is formed by an atomic layer deposition method or a sputtering method. The thickness of the insulating film 32 ranges from, for example, about 5 nm to about 100 nm. As for the insulating film, an oxide film such as a silicon oxide film or a titanium oxide film, or a nitride film such as an aluminum nitride film, a silicon nitride film, or a boron nitride film may be used.

Subsequently, as illustrated in FIG. 10C, a resin film 33 is formed on the insulating film 32, and a semiconductor element 34 is mounted on the resin film 33. The semiconductor element 34 is, for example, an in-vehicle integrated circuit (IC), or an IGBT module for an inverter of a hybrid electric vehicle (HEV) or an electric vehicle (EV).

A solder has conventionally been used for bonding the IGBT module to the cooling plate. However, the heat dissipation sheet 200 has a higher heat conductivity than the solder, and thus, it is possible to obtain a better heat dissipation characteristic according to the present embodiment.

Sixth Embodiment

Hereinafter, a sixth embodiment will be described. The sixth embodiment relates to a bump including a carbon nanotube structure. FIGS. 11A to 11F are views illustrating a method of manufacturing a bump according to the sixth embodiment in the order of processes.

As illustrated in FIG. 11A, in the sixth embodiment, first, a catalyst film 42 is formed on a substrate 41. For example, the substrate 41 is an aluminum nitride substrate, and the catalyst film 42 includes an aluminum film having a thickness ranging from about 0.1 nm to about 20 nm and an iron film having a thickness ranging from about 1 nm to about 5 nm on the aluminum film. For example, the catalyst film 42 may be formed by a sputtering method, an EB deposition method, or an MBE method, and patterned by photolithography in the same shape in a plan view as the bumps to be formed. A tantalum film having a thickness ranging from about 5 nm to about 50 nm may be formed between the catalyst film 42 and the substrate 41. The tantalum film suppresses diffusion of gold or platinum into the catalyst film 42 when the substrate 41 includes a gold or platinum electrode.

Subsequently, as illustrated in FIG. 11B, the plurality of carbon nanotubes 101 are formed on the catalyst film 42. The carbon nanotubes 101 may be grown by, for example, a hot filament CVD method. For example, as a raw material gas, a mixed gas of acetylene and argon is used, the substrate temperature is set to range from about 600° C. to about 650° C., and the pressure is set to range from about 0.5 kPa to about 2 kPa. The proportion of acetylene in the mixed gas ranges from, for example 0.1% to 10% by volume. As a dilution gas, a nitrogen gas or a hydrogen gas may be used. When an aluminum film having a thickness of about 15 nm and an iron film having a thickness of about 2.5 nm are used for the catalyst film 42, the substrate temperature is set to about 620° C., and the pressure is set to about 1 kPa, the carbon nanotubes 101 having a length of about 20 µm is obtained for about 20 min.

Figure 11D:
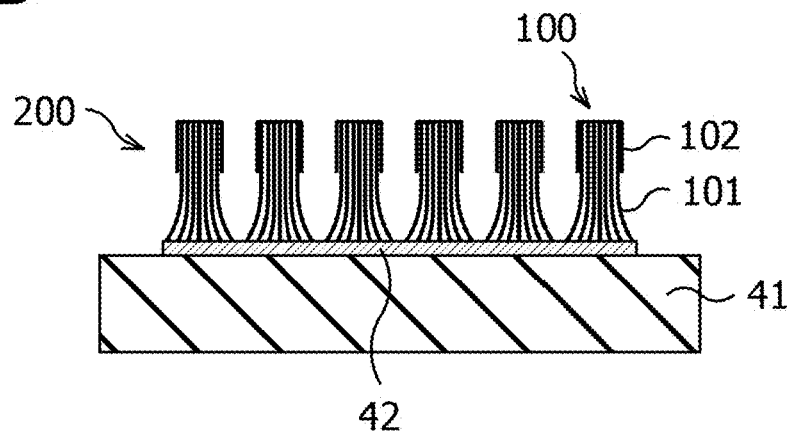

Thereafter, as illustrated in FIG. 11C, a bundle of carbon nanotubes 101 is irradiated with an electron beam. As a result, as illustrated in FIG. 11D, the carbon nanotubes 101 partially melts or evaporates at the side irradiated with the electron beam, and almost at the same time, graphite films 102 which bind one ends of the carbon nanotubes 101 are formed using molten or evaporated carbon as a raw material. In this manner, carbon nanotube structures 100 each including a plurality of carbon nanotubes 101 and a graphite film 102 are formed, and a heat dissipation sheet 200 including a plurality of carbon nanotube structures 100 is obtained.

Figure 11E:
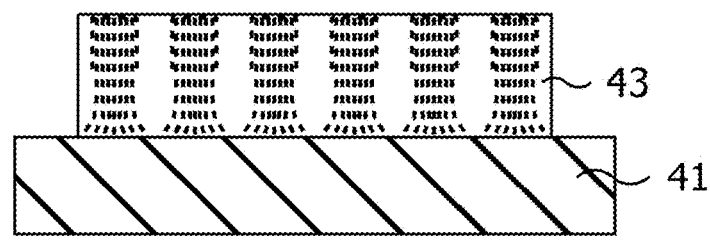

Subsequently, as illustrated in FIG. 11E, a plating film 43 is formed which covers the heat dissipation sheet 200. As the plating film 43, for example, a gold film is formed. In the present embodiment, since the carbon nanotubes 101 are irradiated with the electron beam prior to the formation of the plating film 43, the plating film 43 tends to be easily wet and spread, and a plating unevenness hardly occurs. In this manner, bumps 40 according to the sixth embodiment may be formed.

Figure 11F:
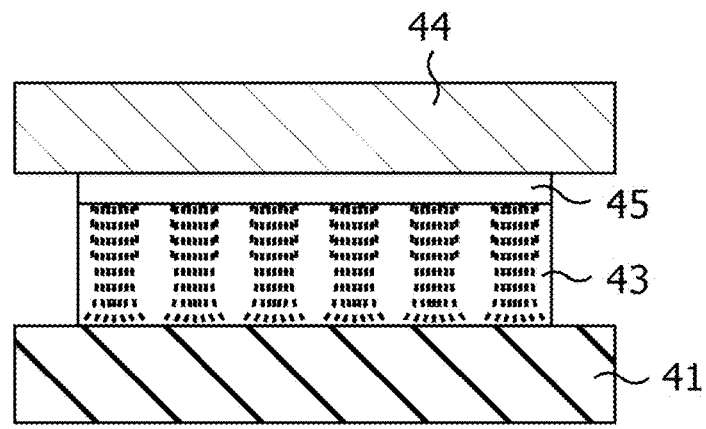

Thereafter, as illustrated in FIG. 11F, a metal film 45 provided on a semiconductor element 44 is bonded to the bumps 40. The semiconductor element 44 is, for example, a high power amplifier (HPA) including a gallium nitride (GaN)-based high electron mobility transistor (HEMT).

As described above, the bumps 40 according to the sixth embodiment include carbon nanotube structures 100, and a plating film 43 that covers the carbon nanotube structures 100. The bumps 40 have an excellent heat conductivity and an excellent conductivity.

Seventh Embodiment

Figure 12A:
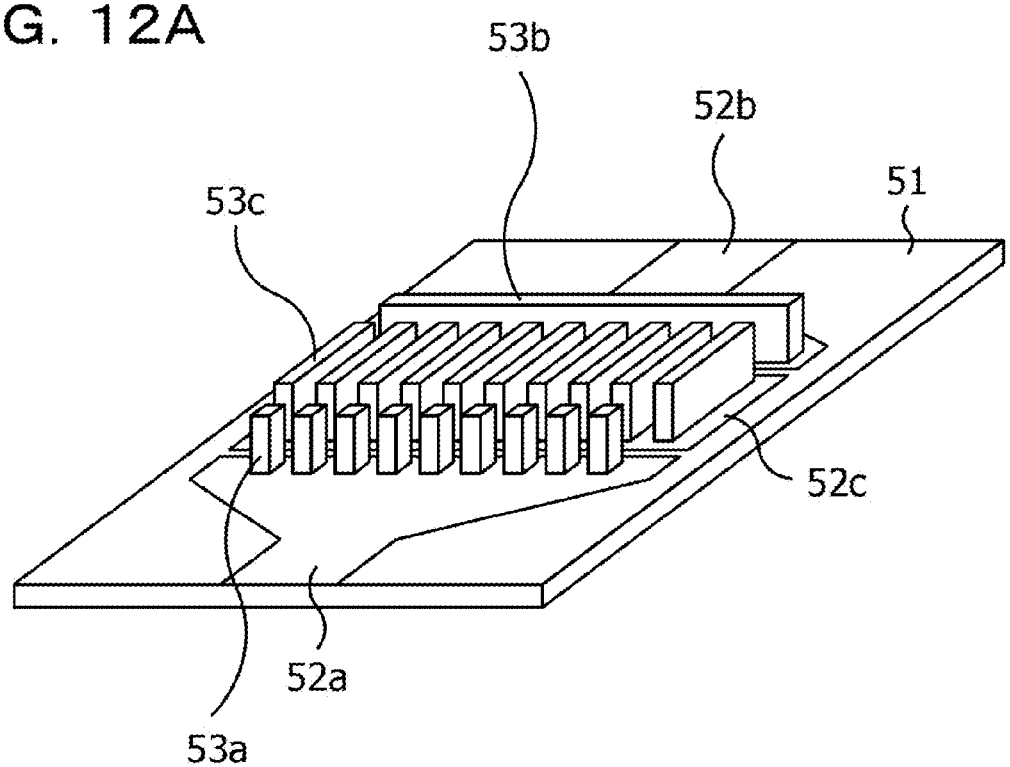
FIGS. 12A and 12B are perspective views illustrating a semiconductor device according to a seventh embodiment.
Figure 12B:
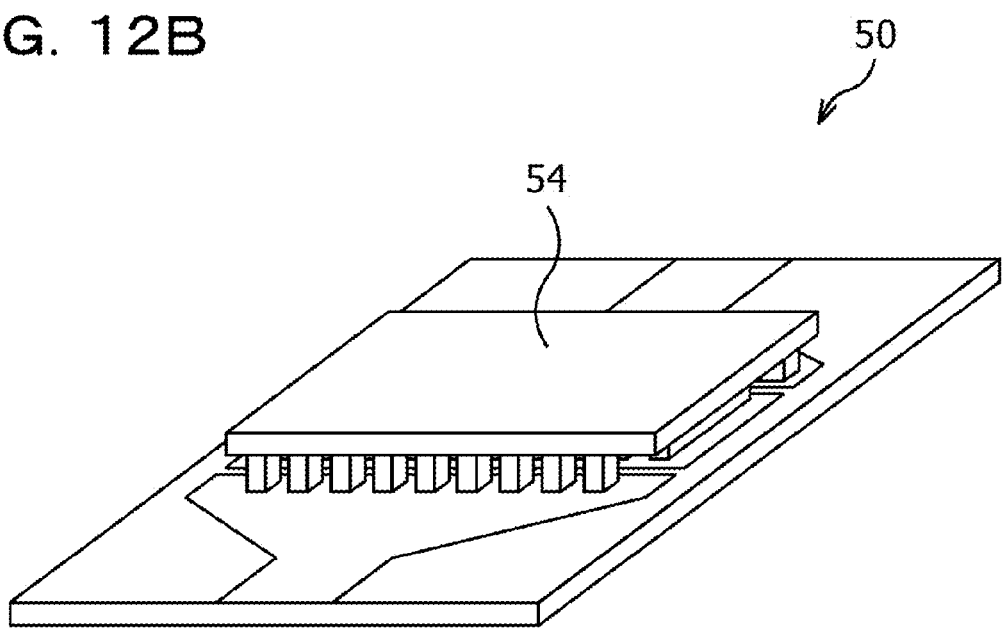

Hereinafter, a seventh embodiment will be described. The seventh embodiment relates to a semiconductor device including a bump. FIGS. 12A and 12B are perspective views illustrating a semiconductor device according to the seventh embodiment.

A semiconductor device 50 according to the seventh embodiment includes a substrate 51, and an input pattern 52a, an output pattern 52b, and a ground pattern 52c on the substrate 51, as illustrated in FIG. 12A. The substrate 51 corresponds to the substrate 41 according to the sixth embodiment. The semiconductor device 50 also includes bumps 53a on the input pattern 52a, a bump 53b on the output pattern 52b, and bumps 53c on the ground pattern 52c. The bumps 53a, the bump 53b, and the bumps 53c corresponds to the bumps 40 according to the sixth embodiment. As illustrated in FIG. 12B, a semiconductor element 54 is mounted on the bumps 53a, the bump 53b, and the bumps 53c. The semiconductor element 54 is an HPA including a GaN-based HEMT which includes a gate terminal connected to the bump 53a, a source terminal connected to the bump 53c, and a drain terminal connected to the bump 53b. Such a semiconductor device 50 is suitable for, for example, a base station for a wireless communication or a mobile phone communication.

Figure 13:
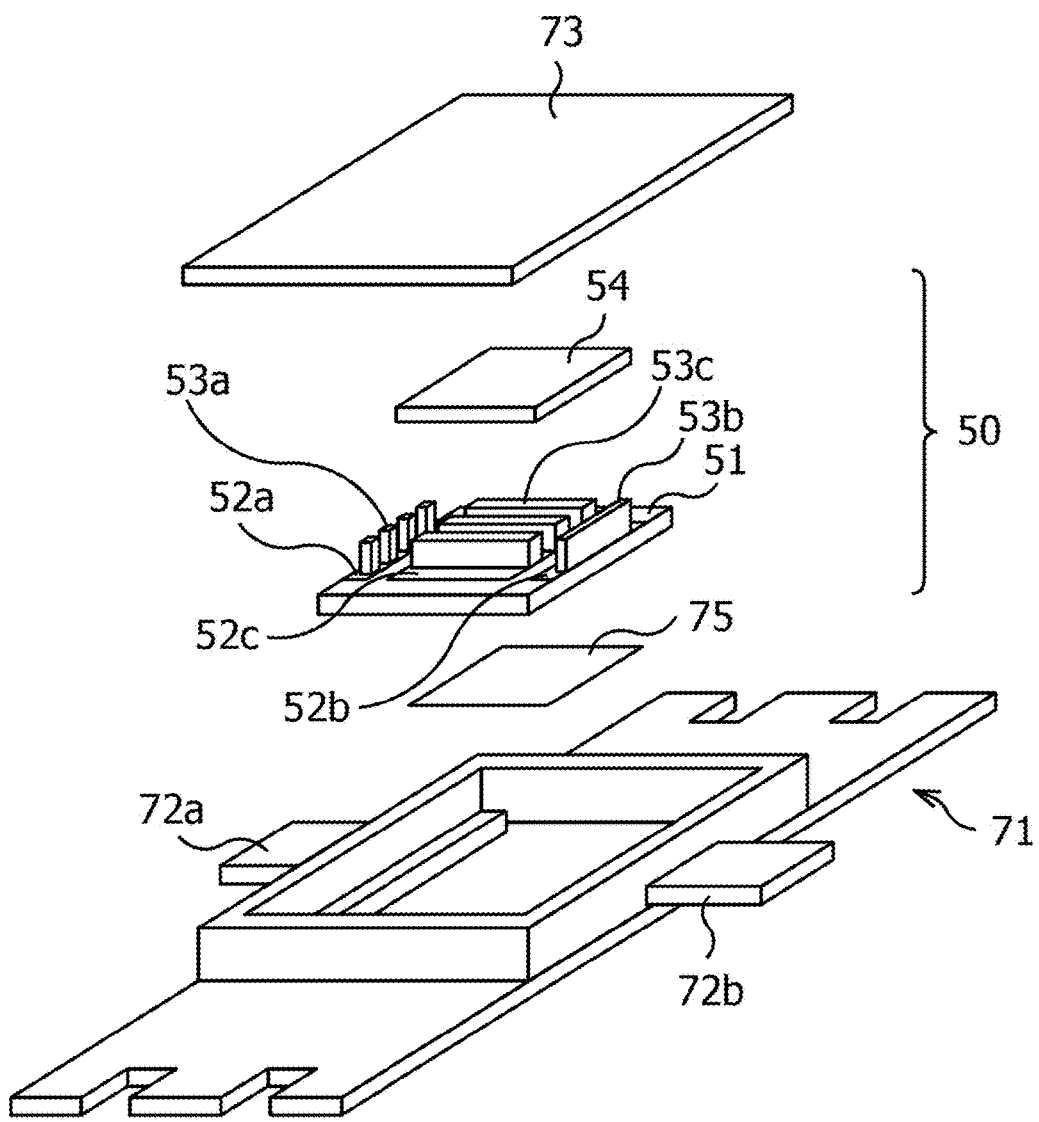
FIG. 13 is an exploded perspective view illustrating a package structure including the semiconductor device according to the seventh embodiment.

FIG. 13 illustrates an exploded perspective view illustrating a package structure including the semiconductor device 50 according to the seventh embodiment. In this example, the semiconductor device 50 is accommodated in a package 71 including an input terminal 72a and an output terminal 72b via an AuSn film 75. The input pattern 52a is connected to the input terminal 72a, the output pattern 52b is connected to the output terminal 72b, and the ground pattern 52c is connected to the bottom of the package 71 via the AuSn film 75.

When the graphite film is formed, the graphite film may be irradiated with a laser beam instead of an electron beam. For example, the graphite film may be formed while one ends of the plurality of carbon nanotubes are fused with each other by being irradiated with the laser beam (YAG laser, output power: about 300 W to about 600 W, and a spot size: about 50 µm to about 100 µm).

Eighth Embodiment

Hereinafter, an eighth embodiment will be described. The eighth embodiment corresponds to a modification to the second embodiment. FIGS. 14A to 14F are views illustrating a method of manufacturing the heat dissipation sheet according to the eighth embodiment in the order of processes.

As illustrated in FIG. 14A, in the eighth embodiment, first, processes up to the press-bonding of the bundle of the carbon nanotubes 101 to the heat spreader 10 and the removal of the transfer substrate 23 are performed, as in the second embodiment. Subsequently, as illustrated in FIG. 14B, a resin sheet 12 is provided at the tip end of the bundle of the carbon nanotubes 101. As for a material for the resin sheet 12, for example, thermoplastic resins such as a polyamide-based thermoplastic resin, a polyurethane-based thermoplastic resin, and a polyolefin-based thermoplastic resin, thermosetting resins such as a polyimide-based thermosetting resin and an epoxy-based thermosetting resin, acrylic resins, silicone resins, polyvinyl resins and waxes may be exemplified. These resins may easily penetrate into the bundle of the carbon nanotubes 101. For example, the thickness of the resin sheet 12 ranges from about 5 µm to about 20 µm.

Figure 14D:
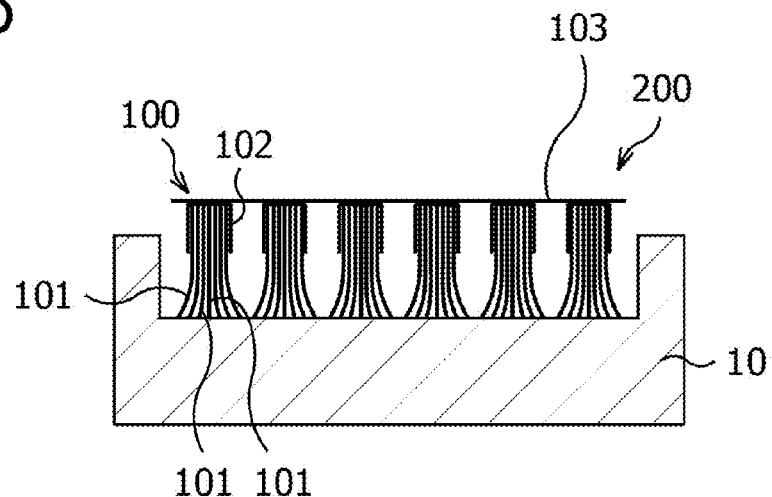

Subsequently, as illustrated in FIG. 14C, the resin sheet 12 and the bundle of the carbon nanotubes 101 are irradiated with an electron beam. As a result of the electron beam irradiation, as illustrated in FIG. 14D, the carbon nanotubes 101 partially melts or evaporates at the side irradiated with the electron beam, and almost at the same time, the graphite films 102 which bind one ends of the carbon nanotubes 101 are formed using molten or evaporated carbon as a raw material. Similarly, a graphite film 103 is formed from the resin sheet 12. When the thickness of the resin sheet 12 is about 5 μm, the thickness of the graphite film 103 ranges from about 5 nm to 500 nm because the resin sheet partially melts or evaporates. In this manner, the carbon nanotube structures 100 each including a plurality of carbon nanotubes 101 and a graphite film 102 are formed, and the heat dissipation sheet 200 including the graphite film 103 and the plurality of carbon nanotube structures 100 is obtained.

Figure 14E:
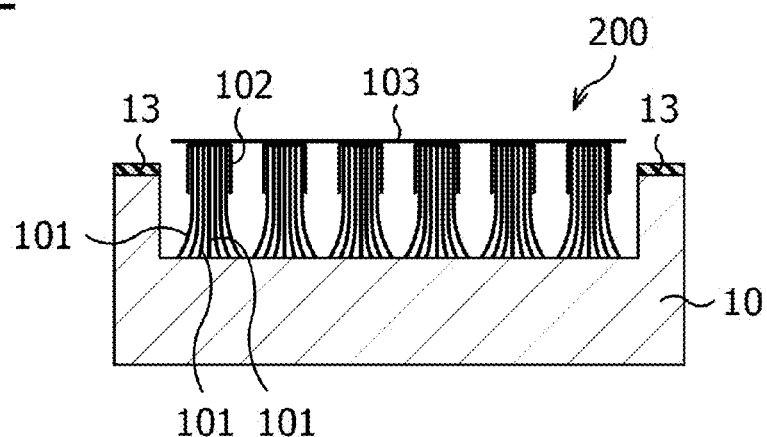
Figure 14F:
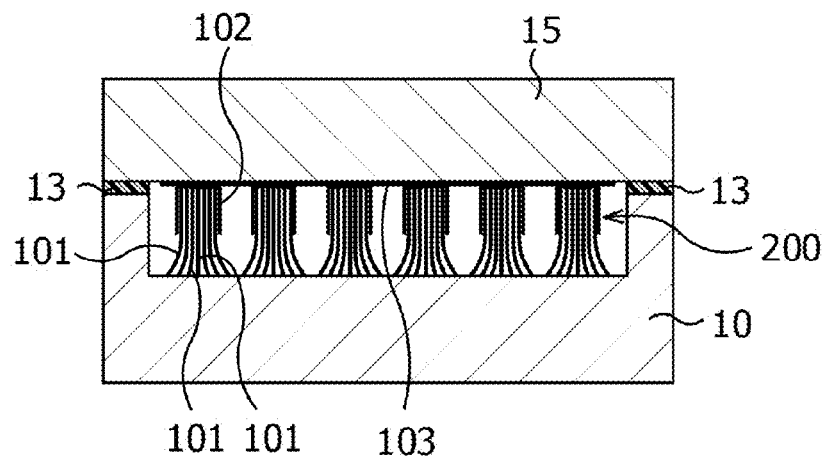

Then, when the heat spreader 10 is attached to the semiconductor element, as illustrated in FIG. 14E, the sealant 13 is applied to the tip end of the container-shaped heat spreader 10, and as illustrated in FIG. 14F, the heat spreader 10 is fixed to the semiconductor element 15 such that the heat dissipation sheet 200 is interposed between the heat spreader 10 and the semiconductor element 15. Here, a stress acts on the heat dissipation sheet 200 substantially parallel to a direction in which the carbon nanotubes 101 extend. However, the carbon nanotubes 101 are bound and reinforced by the graphite film 102, and thus hardly buckle.

In this manner, the heat dissipation sheet according to the eighth embodiment may be manufactured.

Ninth Embodiment

Hereinafter, a ninth embodiment will be described. The ninth embodiment corresponds to a modification to the fourth embodiment. FIGS. 15A to 15C are views illustrating a method of manufacturing the heat dissipation sheet according to the ninth embodiment in the order of processes.

As illustrated in FIG. 15A, in the ninth embodiment, first, a catalyst film 22 is formed on the substrate 21 and a plurality of carbon nanotubes 101 are formed on the catalyst film 22, as in the fourth embodiment. Subsequently, as illustrated in FIG. 15B, the resin sheet 12 is provided at the tip end of the bundle of the carbon nanotubes 101, and the resin sheet 12 and the bundle of the carbon nanotubes 101 are irradiated with an electron beam. As a result of the electron beam irradiation, as illustrated in FIG. 15C, the carbon nanotubes 101 partially melts or evaporates at the side irradiated with the electron beam, and almost at the same time, the graphite films 102 which bind one ends of the carbon nanotubes 101 are formed using molten or evaporated carbon as a raw material. Similarly, the graphite film 103 is formed from the resin sheet 12. In this manner, carbon nanotube structures 100 each including a plurality of carbon nanotubes 101 and a graphite film 102 are formed, and a heat dissipation sheet 200 including a graphite film 103 and a plurality of carbon nanotube structures 100 is obtained. Thereafter, in the same manner as in the fourth embodiment, processes after the transfer substrate 23 is attached (see FIG. 9D) are performed.

In this manner, the heat dissipation sheet according to the ninth embodiment may be manufactured.

Tenth Embodiment

Hereinafter, a tenth embodiment will be described. The tenth embodiment corresponds to a modification the sixth embodiment. FIGS. 16A to 16G are views illustrating a method of manufacturing a bump according to the tenth embodiment in the order of processes.

As illustrated in FIG. 16A, in the tenth embodiment, first, a catalyst film 42 is formed on the substrate 41. Subsequently, as illustrated in FIG. 16B, a plurality of carbon nanotubes 101 are formed on the catalyst film 42. Thereafter, as illustrated in FIG. 16C, the resin sheet 12 is provided at the tip end of the bundle of the carbon nanotubes 101.

Figure 16E:
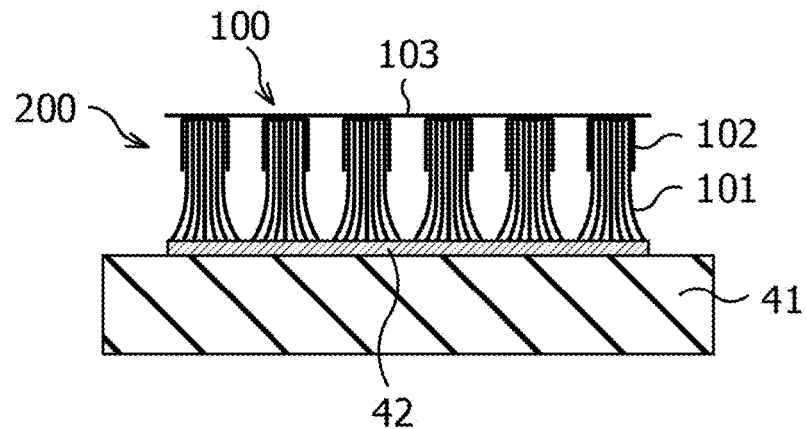
FIGS. 16E to 16G are views illustrating a method of manufacturing the bump in the order of processes subsequently to FIGS. 16A to 16D.

Subsequently, as illustrated in FIG. 16D, the resin sheet 12 and the bundle of the carbon nanotubes 101 are irradiated with an electron beam. As a result, as illustrated in FIG. 16E, the carbon nanotubes 101 partially melts or evaporates at the side irradiated with the electron beam, and almost at the same time, the graphite films 102 which bind one ends of the carbon nanotubes 101 are formed using molten or evaporated carbon as a raw material. Similarly, a graphite film 103 is formed from the resin sheet 12. In this manner, the carbon nanotube structures 100 each including a plurality of carbon nanotubes 101 and a graphite film 102 are formed and a heat dissipation sheet 200 including a graphite film 103 and a plurality of carbon nanotube structures 100 is obtained.

Figure 16F:
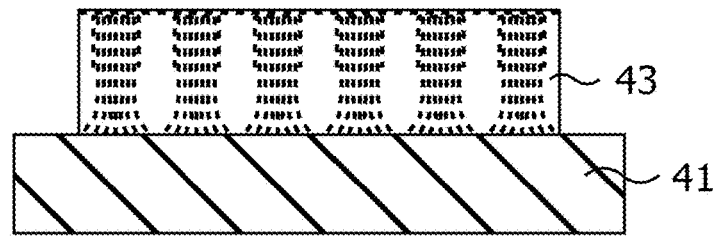
Figure 16G:
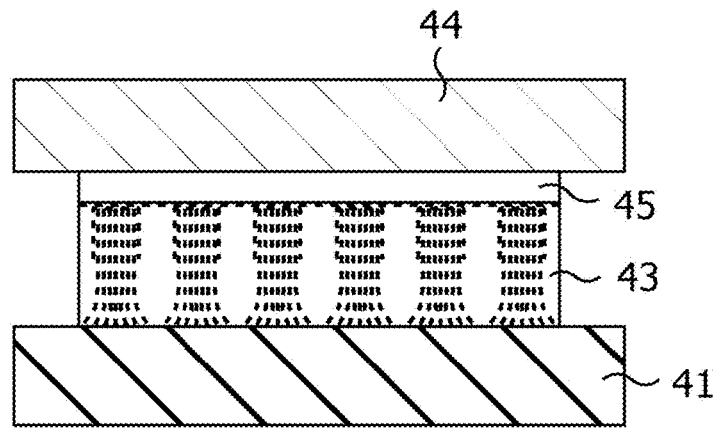

Subsequently, as illustrated in FIG. 16F, the plating film 43 that covers the heat dissipation sheet 200 is formed. As the plating film 43, for example, a gold film is formed. In the present embodiment, since the carbon nanotubes 101 are irradiated with the electron beam prior to the formation of the plating film 43, the plating film 43 tends to be easily wet and spread, and a plating unevenness hardly occurs. In this manner, the bumps 40 related to the tenth embodiment may be formed. Thereafter, as illustrated in FIG. 16G, the bumps 40 are bonded to the metal film 45 provided on the semiconductor element 44.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A carbon nanotube structure comprising:
 a plurality of carbon nanotubes each having a first end and a second end in a longitudinal direction; and
 a graphite film that binds only the first ends of the plurality of carbon nanotubes.

2. The carbon nanotube structure according to claim 1, wherein the plurality of carbon nanotubes are fused with each other at the first ends.

3. The carbon nanotube structure according to claim 1, wherein a thickness of the graphite film ranges from about 1 nm to about 100 nm.

4. The carbon nanotube structure according to claim 1, wherein a length of a portion of the plurality of carbon nanotubes bound by the graphite film ranges from about 50 nm to about 500 nm.

5. A heat dissipation sheet comprising:
 a plurality of carbon nanotube structures arranged in a sheet form,
 wherein each of the carbon nanotube structures includes:
  a plurality of carbon nanotubes each having a first end and a second end in a longitudinal direction; and
  a graphite film that binds only the first ends of the plurality of carbon nanotubes.

6. The heat dissipation sheet according to claim 5, wherein the plurality of carbon nanotubes are fused with each other at the first ends.

7. The heat dissipation sheet according to claim 5, wherein a thickness of the graphite film ranges from about 1 nm to about 100 nm.

8. The heat dissipation sheet according to claim 5, wherein a length of a portion of the plurality of carbon nanotubes bound by the graphite film ranges from about 50 nm to about 500 nm.

9. A method of manufacturing a carbon nanotube structure, the method comprising:
providing a plurality of carbon nanotubes each having a first end and a second end in a longitudinal direction; and
forming a graphite film that binds only the first ends of the plurality of carbon nanotubes by irradiating the first ends with an electron beam or a laser light.

10. The method according to claim 9, further comprising:
arranging a resin sheet at the first ends before irradiating the one ends with the electron beam or the laser light.

* * * * *